United States Patent
Ruan et al.

(10) Patent No.: US 10,558,291 B2
(45) Date of Patent: Feb. 11, 2020

(54) TOUCH SENSITIVE COVER PLATE AND MANUFACTURING METHOD THEREOF, AND TOUCH SENSITIVE DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yiping Ruan, Beijing (CN); Pei Li, Beijing (CN); Yu Zhou, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/552,281

(22) PCT Filed: Feb. 27, 2017

(86) PCT No.: PCT/CN2017/074978
§ 371 (c)(1),
(2) Date: Aug. 20, 2017

(87) PCT Pub. No.: WO2017/211097
PCT Pub. Date: Dec. 14, 2017

(65) Prior Publication Data
US 2018/0239484 A1    Aug. 23, 2018

(30) Foreign Application Priority Data
Jun. 6, 2016    (CN) .......................... 2016 1 0393568

(51) Int. Cl.
*G06F 3/038*    (2013.01)
*G06F 3/041*    (2006.01)
(Continued)

(52) U.S. Cl.
CPC ........ *G06F 3/0416* (2013.01); *G02F 1/13338* (2013.01); *G06F 3/041* (2013.01);
(Continued)

(58) Field of Classification Search
USPC ........ 345/173, 174, 156, 179, 168, 204, 206
See application file for complete search history.

(56) References Cited

U.S. PATENT DOCUMENTS

2007/0182720 A1* 8/2007 Fujii ..................... G06F 3/0416
345/173
2010/0079425 A1* 4/2010 Yamazaki ........... H01L 27/1214
345/206
(Continued)

FOREIGN PATENT DOCUMENTS

CN     104020917 A    9/2014
CN     203827313 U    9/2014
(Continued)

OTHER PUBLICATIONS

International Search Report and Written Opinion dated May 17, 2017, for corresponding PCT Application No. PCT/CN2017/074978.
(Continued)

*Primary Examiner* — Thuy N Pardo
(74) *Attorney, Agent, or Firm* — Kinney & Lange, P.A.

(57) ABSTRACT

A touch sensitive cover plate is disclosed. The touch sensitive cover plate includes: a cover plate body having at least one key located in a key region of cover plate body; and at least one wire arranged on a back side of the cover plate body and used for the key. The wire is configured to connect the key to a circuit board located outside of the key region. A method of manufacturing the touch sensitive cover plate and a display device having the touch sensitive cover plate are also disclosed.

20 Claims, 3 Drawing Sheets

(51) Int. Cl.
*G02F 1/1333* (2006.01)
*G06F 3/047* (2006.01)
*H05K 1/18* (2006.01)

(52) U.S. Cl.
CPC ............ *G06F 3/047* (2013.01); *G06F 3/0412* (2013.01); *H05K 1/189* (2013.01); *G06F 2203/04103* (2013.01)

(56) References Cited

U.S. PATENT DOCUMENTS

| | | | | |
|---|---|---|---|---|
| 2010/0164870 A1* | 7/2010 | Kunthady | ............ | H01H 13/704 345/168 |
| 2010/0207906 A1* | 8/2010 | Anglin | ................... | G06F 3/0414 345/174 |
| 2011/0254805 A1* | 10/2011 | Tanimizu | .............. | G06F 3/0416 345/174 |
| 2011/0278078 A1 | 11/2011 | Schediwy et al. | | |
| 2013/0002624 A1* | 1/2013 | Yamazaki | ............ | H01L 27/1214 345/204 |
| 2014/0375606 A1* | 12/2014 | Abe | .................... | G02F 1/13338 345/174 |
| 2015/0130760 A1* | 5/2015 | Kim | ......................... | G06F 3/044 345/174 |
| 2015/0153764 A1* | 6/2015 | Park | ......................... | G06F 3/044 345/173 |
| 2015/0153864 A1* | 6/2015 | Yoshiyama | ............. | G06F 3/044 345/173 |
| 2015/0261365 A1* | 9/2015 | Hong | .................... | G06F 3/0412 345/173 |
| 2015/0363023 A1* | 12/2015 | Kawaguchi | ............. | G06F 3/044 345/174 |
| 2016/0085349 A1* | 3/2016 | Oohira | ................ | G02F 1/13338 345/173 |
| 2016/0154499 A1* | 6/2016 | Bae | ......................... | G06F 3/044 345/174 |
| 2016/0188042 A1* | 6/2016 | Tomita | .................... | G06F 3/045 345/174 |
| 2016/0195963 A1* | 7/2016 | Esaka | ..................... | G06F 3/044 345/174 |
| 2016/0202801 A1* | 7/2016 | Odagiri | .................. | G06F 3/044 345/174 |

FOREIGN PATENT DOCUMENTS

| | | |
|---|---|---|
| CN | 104199515 A | 12/2014 |
| CN | 104391595 A | 3/2015 |
| CN | 104639140 A | 5/2015 |
| CN | 106020554 A | 10/2016 |

OTHER PUBLICATIONS

First Chinese Office Action dated May 28, 2018, for corresponding Chinese Application No. 201610393568.3.

* cited by examiner

TOUCH SENSITIVE COVER PLATE AND MANUFACTURING METHOD THEREOF, AND TOUCH SENSITIVE DISPLAY DEVICE

CROSS-REFERENCE TO RELATED APPLICATION

This application is a Section 371 National Stage Application of International Application No. PCT/CN2017/074978, filed on 22 Feb. 2017, entitled "TOUCH SENSITIVE COVER PLATE AND MANUFACTURING METHOD THEREOF, AND TOUCH SENSITIVE DISPLAY DEVICE", which claims priority to Chinese Application No. 201610393568.3, filed on 6 Jun. 2016, incorporated herein by reference in its entirety.

TECHNICAL FIELD

The present disclosure relates to the field of display technologies, and especially, to touch sensitive cover plate, manufacturing method thereof and a touch sensitive display device.

BACKGROUND

Touch control function of an on-cell touch screen has been integrated into an in-cell or on-cell structure, but this integration is limited only to a display region of a liquid crystal display (LCD). A key region of the on-cell touch screen is not integrated with a touch sensitive function.

Currently, functional keys of in-cell and on-cell display modules mainly include the following two types: 1) the display region of the LCD is realized by virtual functional keys, and a cover plate (CG) is not provided with keys; and 2) a flexible printed circuit (FPC) board is provided at a back side of the key region of the CG, so as to achieve a key function.

However, the following technical problems exist in existing technical themes: if the functional keys are provided by the first manner, then the display region of the LCD screen will be reduced due to the functional keys which will occupy a space of the display region; and if the functional keys are provided by the second manner, then a space needs to be created structurally for the FPC because the FPC has a certain thickness, which will increase a thickness of the key region.

SUMMARY

An object of the present invention to provide a touch sensitive cover plate and manufacturing method thereof, and a touch sensitive display device, to at least partially overcome or alleviate the above mentioned technical problems.

To achieve the above objection, there is provided a touch sensitive cover plate and a touch sensitive display device having such touch sensitive cover plate, and a method of manufacturing such touch sensitive cover plate.

According to an aspect of the present disclosure, there is provided a touch sensitive cover plate.

According to an exemplary embodiment, the touch sensitive cover plate includes: a cover plate body having at least one key located in a key region of cover plate body; and at least one wire arranged on a back side of the cover plate body and used for the key. The wire is configured to connect the key to a circuit board located outside of the key region.

According to another exemplary embodiment, the key includes a touch key and the touch sensitive cover plate further comprises a key pattern disposed on the back side of the cover plate body.

According to another exemplary embodiment, a first end of the wire is connected with the key pattern and a second end of the wire is connected with the circuit board.

According to another exemplary embodiment, the touch sensitive cover plate further includes a first ink layer, which is located between the cover plate body and the key pattern and between the cover plate body and the wire.

According to another exemplary embodiment, the touch sensitive cover plate further includes a first insulation layer, which is located between the first ink layer and the key pattern and between the first ink layer and the wire.

According to another exemplary embodiment, the touch sensitive cover plate further includes a second ink layer located above the key pattern and the wire.

According to another exemplary embodiment, the touch sensitive cover plate further includes a second insulation layer, which is located between the key pattern and the second ink layer and between the wire and the second ink layer.

According to another exemplary embodiment, the touch sensitive cover plate further includes a touch key indicator corresponding to the key pattern, the touch key indicator being located at the back side of the cover plate body and viewable from the front side of the cover plate body.

According to another exemplary embodiment, the key pattern is provided with a window region, the first ink layer is provided with a first opening region at a position aligned with the window region, and the first opening region is configured to allow light emitted from the window region to be transmitted out from the first opening region.

According to another exemplary embodiment, the key pattern is provided with a window region, the second ink layer is provided with a second opening region at a position aligned with the window region, and the second opening region is configured to allow light emitted from a light source to be transmitted to the window region.

According to another exemplary embodiment, the wire is arranged around the key pattern.

According to another exemplary embodiment, the second end of the wire and the circuit board are connected in a lapping region located at one side of the key region.

According to another exemplary embodiment, the touch sensitive cover plate includes: a plurality of touch keys; a plurality of key patterns each corresponding to a corresponding one of the touch keys; a plurality of wires; and two lapping regions. The two lapping regions are located at two opposite sides of the key region respectively, second ends of a part of the plurality of wires are connected to one of the two lapping regions, and second ends of another part of the plurality of key wires are connected to the other one of the two lapping regions.

According to another exemplary embodiment, the key pattern and the wire are arranged in the same layer.

According to another aspect of the present disclosure, there is provided a touch sensitive display device.

According to an exemplary embodiment, the touch sensitive display device includes: a display panel; a touch sensitive cover plate disposed on the display panel; and a touch control circuit. The touch sensitive cover plate is the touch sensitive cover plate according to any one of the above embodiments, and the wire is connected to the touch control circuit.

According to another exemplary embodiment, the touch sensitive display device further includes: a circuit board bonded to the back side of the cover plate body, a first end of each wire is connected to the key, a second end of each wire is connected with a first end of the circuit board, and a second end of the circuit board is connected to the touch control circuit.

According to a further aspect of the present disclosure, there is provided a method of manufacturing a touch sensitive cover plate.

According to an exemplary embodiment, the method of manufacturing a touch sensitive cover plate comprises: forming at least one wire on a back side of a cover plate body, where the cover plate body has at least one key located in a key region of the cover plate body, and the wire is formed to connect the key to a circuit board located outside of the key region.

According to another exemplary embodiment, the key comprises a touch key and the touch sensitive cover plate further comprises a key pattern disposed on the back side of the cover plate body, and the step of forming at least one wire on the back side of the cover plate body comprises: forming the key pattern and the wire on the back side of the cover plate body through screen printing, exposing, or a photolithography process.

According to another exemplary embodiment, the method of manufacturing a touch sensitive cover plate further comprises: forming, on the back side of the cover plate body, a touch key indicator corresponding to the key pattern before forming the key pattern and the wire.

According to another exemplary embodiment, the method of manufacturing a touch sensitive cover plate further comprises: forming a first ink layer on the back side of the cover plate body and forming a first insulation layer on the first ink layer, before forming the key pattern and the key wire; forming a second insulation layer on the key pattern and the wire; bonding a circuit board to the back side of the cover plate body, such that a second end of the wire is connected with a first end of the circuit board, a second end of the circuit board is connected with the touch control circuit; and forming a second ink layer on the second insulation layer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF EMBODIMENTS

Figure 1:
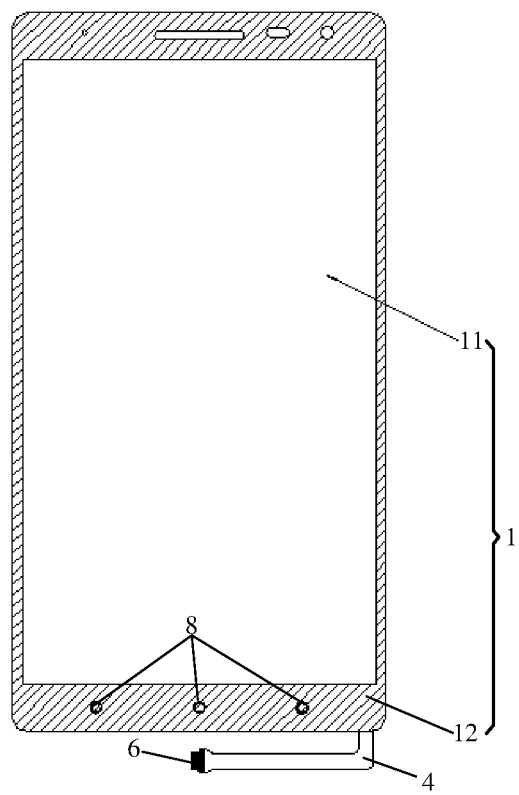
FIG. 1 is a schematic structural drawing showing a touch sensitive cover plate according to an embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

Figure 2:
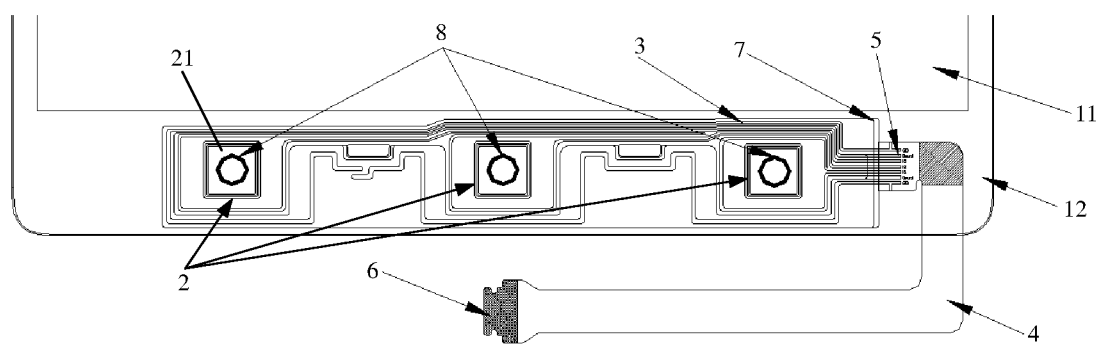
FIG. 2 is a schematic partial structural drawing showing a back side of a body of the cover plate of FIG. 1.
Figure 3:
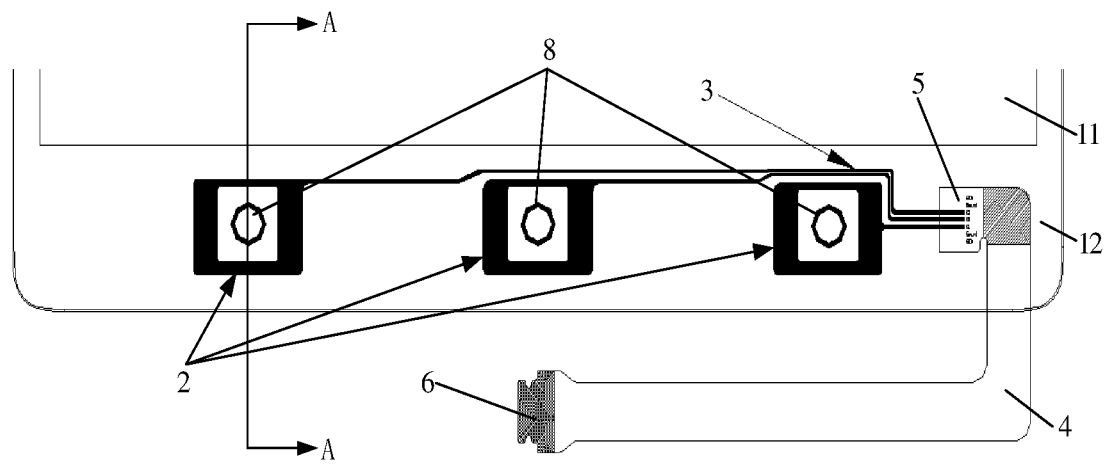
FIG. 3 is a schematic structural drawing showing a pattern and wiring of keys of FIG. 2.

In one aspect, a schematic structural drawing of a touch sensitive cover plate according to an embodiment of the present disclosure is shown in FIG. 1, FIG. 2 is a schematic partial structural drawing showing a back side of a body of the cover plate of FIG. 1, and FIG. 3 is a schematic structural drawing showing a pattern and wiring of keys of FIG. 2. As shown in FIGS. 1, 2 and 3, the touch sensitive cover plate includes a cover plate body 1 having at least one key located in a key region of the cover plate body; and at least one wire 3 disposed at a back side of the cover plate body. The wire is configured to connect the key to a circuit board outside of the key region.

In an exemplary embodiment, the key may be a push-down key or a touch key. If the key is a push-down key, one end of the wire 3 may be located underneath the key 1, and when pressed down, the key 1 is connected with the wire 3.

If the key is a touch key, one end of the wire 3 may directly be connected to the touch key. Specifically, in an exemplary embodiment, the key is a touch key, and the touch sensitive cover plate further includes a key pattern 2 arranged at the back side of the cover plate body and connected with the wire 3.

As shown in FIG. 1, the cover plate body 1 comprises a display region 11 and a key region 12 located below the display region 11. The key pattern 2 and the key wire 3 are located within the key region 12. Since the key pattern 2 and the wire 3 both are located at the back side of the cover plate body 1, the key pattern 2 and the wires 3 are not shown in FIG. 1.

FIG. 1 shows a front side of the cover plate body 1, which is a side facing a user when the user is using the touch sensitive display device, that is, the front side of the cover plate body 1 is a side facing away from the inside of the touch sensitive display device. FIG. 2 shows the back side of the cover plate body 1, which is a side of the cover plate body 1 facing away from the user who is using the touch sensitive display device, that is, the back side of the cover plate body 1 is a side facing towards the inside of the touch sensitive display device.

In order to clearly show the wire 3, some primary wires 3 are shown in FIG. 3, and it can be seen clearly from FIG. 3 that the wires 3 are connected with the key pattern 2.

There may be one or more key patterns 2 (for example, 3, as shown in FIG. 2 and FIG. 3). Each functional key pattern 2 is connected with a corresponding wire 3. As shown in FIG. 2 and FIG. 3, the wires 3 are disposed around the key pattern 2.

In the present embodiment, a thickness of the key pattern 2 is 0.01 mm to 0.06 mm, and preferably, the thickness of the key pattern 2 is 0.04 mm. Since the thickness of the key pattern 2 is relatively small, it does not interfere with other components structurally.

As shown in FIG. 2 and FIG. 3, a first end of the wire 3 is connected with the key pattern 2, and a second end of the wire 3 is bonded to a first end of a circuit board located at the back side of the cover plate body 1. To be noted, the circuit board may be any kind of circuit board, for example, it may be a flexible circuit board 4 commonly used in an electronic product. The present disclosure is described by taking the flexible circuit board as an example.

In the present embodiment, a first end of the flexible circuit board 4 is bonded to the back side of the cover plate body 1, and specifically, the first end of the flexible circuit board 4 is bonded in the key region 12. A lapping region 5 is provided in the key region 12, and a second end of the wire 3 is connected with the first end of the flexible circuit board 4 in the lapping region 5. The lapping region 5 may be located at one side of the key pattern 2, such that the second end of the wire 3 is located at the side of the key pattern 2. For example, in FIG. 2 and FIG. 3, the lapping region 5 is located at the right side of the key pattern 2, and therefore, the second end of the wire 3 is also located at the right side of the right side of the key pattern 2. Alternatively, in an embodiment that is not shown, the lapping region 5 and the second end of the wire 3 may also be located at the left side of the key pattern 2. In another embodiment that is not shown, each side of the key pattern may be provided with a lapping region, and second ends of some wires are connected to a first lapping region located at one side of the key pattern, and second ends of other key wires are connected to a second lapping region located at the other side of the key pattern. Accordingly, two flexible circuit boards connected to the two lapping regions respectively may be provided.

The first end of the flexible circuit board 4 is provided with a first connecting pattern, the second end of the wire 3 is provided with a second connecting pattern, the first connecting pattern and the second connecting pattern are connected with each other in the lapping region 5. In an exemplary embodiment, the first connecting pattern and the second connecting pattern may be pressed together through an anisotropic conductive film (ACF), such that the first connecting pattern is connected with the second connecting pattern, and in turn, connection between the flexible circuit board 4 and the wire 3 in the lapping region 5 can be achieved. A material for each of the first connecting pattern and the second connecting pattern may be, for example, metal. The second end of the flexible circuit board 4 is provided with a connecting region 6 for the flexible circuit board 4. The connecting region 6 may be connected to a main board directly or indirectly through an in-cell or on-cell module, so as to achieve an electrical connection between the flexible circuit board 4 and the main board. Thus, the key wire 3 may be led out by the flexible circuit board 4.

In practice, depending on requirement on production designs, the wires 3 may be arranged in the same layer or different layers. In the case that the wires 3 are arranged in different layers, an insulation layer needs to be provided between wires 3 of different layers. Wires 3 in different layers may be bridged over one another.

Figure 4:
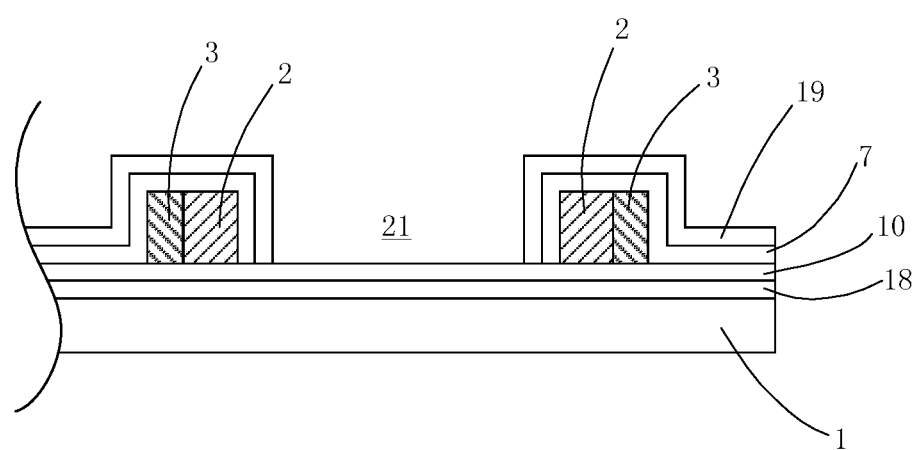
FIG. 4 is a partial cross sectional view taken along the line A-A of FIG. 3.
Figure 5:
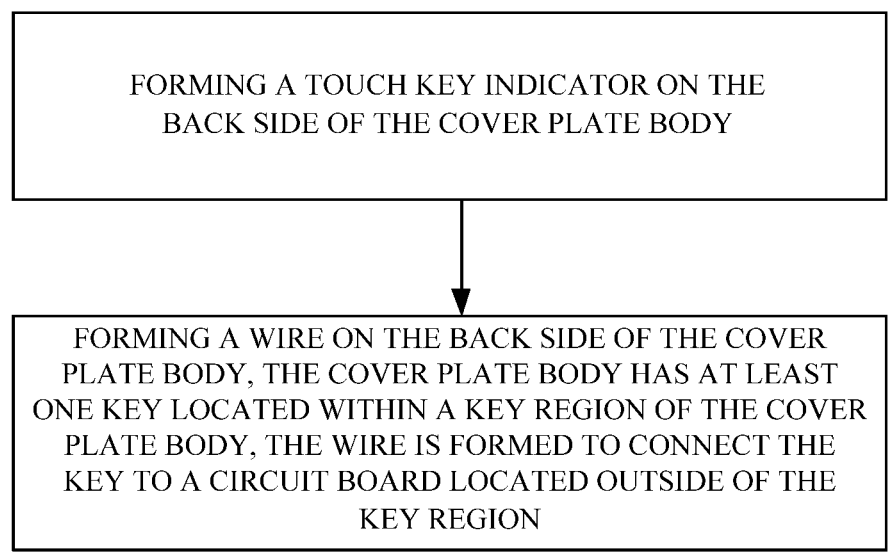
FIG. 5 is a flow chart of a method of manufacturing the cover plate according to the embodiment of the present disclosure.

In the present embodiment, the touch sensitive cover plate further includes a first ink layer 18, which is located at the back side of the cover plate body 1, between the cover plate body 1 and the key pattern 2, and between the cover plate body 1 and the wire 3. In the present embodiment, since the key pattern 2 and the wire 3 are arranged in the same layer, the first ink layer 18 may be located between the cover plate body 1 and the layer in which the key pattern 2 and the wire 3 are arranged, as shown in FIG. 4.

In the present embodiment, the touch sensitive cover plate further includes a first insulation layer 10, which is located between the first ink layer 18 and the key pattern 2, and between the first ink layer 18 and the wire 3. In the present embodiment, since the key pattern 2 and the wire 3 are arranged in the same layer, the first insulation layer 10 is located between the first ink layer 18 and the layer in which the key pattern 2 and the wire 3 are arranged, as shown in FIG. 4.

In the present embodiment, the touch sensitive cover plate further includes a second ink layer 19, which is located above the key pattern 2 and the wire 3. In the present embodiment, since the key pattern 2 and the wire 3 are arranged in the same layer, the second ink layer 19 is thereby located above the layer in which the key pattern 2 and the wire 3 are arranged, as shown in FIG. 4.

In the present embodiment, the touch sensitive cover plate further includes a second insulation layer 7, which is located between the key pattern 2 and the second ink layer 19, and between the wire 3 and the second ink layer 19. In the present embodiment, since the key pattern 2 and the wire 3 are arranged in the same layer, the second insulation layer 7 is located between the layer in which the key pattern 2 and the wire 3 are arranged and the second ink layer 19, as shown in FIG. 4.

In the present embodiment, the touch sensitive cover plate further includes a touch key indicator 8 corresponding to the touch key pattern 2, the touch key indicator 8 is located at the back side of the cover plate body 1 and viewable from the front side of the cover plate body 1, such that a user may perform a corresponding key pressing operation in accordance with the touch key indicator 8. For example, the touch key indicator 8 may include a homepage symbol or a return symbol. The touch key indicators 8 and the touch key patterns 2 are arranged in one-to-one correspondence. Three positions on the back side of the cover plate body 1 corresponding to the touch key indicators 8 are shown in FIG. 3. In the present embodiment, the key pattern 2 and the touch key indicators 8 form the functional keys, and in other words, the functional keys includes the key patterns 2 and the touch key indicators 8, and the key patterns 2 are components having key functions, while the touch key indicators 8 only act as indicators without key functions.

The functional keys may be transparent keys or non-transparent keys, thus, the key patterns 2 may be transparent key patterns or non-transparent key patterns. In an exemplary embodiment, the key patterns 2 are transparent key patterns, and each key pattern 2 has a window region 21, through which light emitted by a light source may pass. Accordingly, the first ink layer 8 is provided therein with a first opening region at a position thereof corresponding to the window region 21; the second ink layer 9 is provided therein with a second opening region at a position corresponding to the window region 21, such that the light emitted by the light source may pass through the first opening region and the second opening region, and then be transmitted to the window region 21. As a conclusion, the light emitted by a light source passes through the second opening region of the second ink layer, the window region 21 of the key pattern 2 and the first opening region of the first ink layer, so that a functional key can be realized as transparent key. Preferably, the touch key indicators 8 may be arranged corresponding to the window regions 21.

In the touch sensitive cover plate provided according to the embodiment, through providing key patterns and wires at the back side of the cover plate body, the problem of functional keys occupying the space of the display region when functional keys are used can be avoided, and thereby the display region of the screen can be increased; at the same time, no flexible circuit board needs to be provided at the back side of the cover plate body, so that the thickness of the key region of the cover plate body is reduced, and the space for the flexible circuit board can be saved structurally.

In another aspect, there is provided a touch sensitive display device. According to an exemplary embodiment, the touch sensitive display device includes a display panel, a touch sensitive cover plate and a touch control circuit, the touch sensitive cover plate is disposed on the display panel. In this embodiment, the touch sensitive cover plate may be the touch sensitive cover plate according to any one of the above embodiments, thus a description of the touch sensitive cover plate is omitted. A wire is connected with the touch control circuit.

Optionally, the touch sensitive cover plate may also include a flexible circuit board, a first end of the flexible circuit board is bonded to the back side of the cover plate body, a first end of the wire is connected with key pattern, and a second end of the wire is connected with the first end of the flexible circuit board, the second end of the flexible circuit board is connected with the touch control circuit, such that the wire is electrically connected to the touch control circuit through the flexible circuit board.

In the present embodiment, the touch sensitive display device may be an in-cell type touch sensitive display device or on-cell type touch sensitive display device.

In the touch sensitive display device provided according to this embodiment, through providing key patterns and wires at the back side of the cover plate body, the problem of functional keys occupying the space of the display region when functional keys are used can be avoided, and thereby the display region of the screen can be increased; at the same time, no flexible circuit board needs to be provided at the back side of the cover plate body, so that the thickness of the key region of the cover plate body is reduced, and the space for the flexible circuit board can be saved structurally.

In a further aspect of the present disclosure, there is provided a method of manufacturing a touch sensitive cover plate. FIG. 4 shows a flow chart of the manufacturing method. The method includes:

Step 101: forming a touch key indicator on the back side of the cover plate body; and Step 102: forming at least one wire on the back side of the cover plate body, where the cover plate body has at least one key located within a key region of the cover plate body, the wire is formed to connect the key to a circuit board located outside of the key region.

In an exemplary embodiment, the key includes a touch key, the touch sensitive cover plate further includes a key pattern located at the back side of the cover plate body, and key pattern and the wire are located within the key region. The touch key indicator is aligned with the key pattern.

In the case of this embodiment, the Step 102 may include: forming the key pattern and the wire on the back side of the cover plate body through screen printing, exposing or a photolithography process. If a screen printing process is used, then the wire is a screen printed silver paste wire or a screen printed copper wire; if an exposing process is used, the wire is an exposed silver paste wire; and if a photolithography process is used, the wire is a photolithographic ITO wire.

In this embodiment, a first end of the wire is connected with the key pattern.

Further, the method may further include the following steps:

forming a first ink layer on the back side of the cover plate body and forming a first insulation layer on the first ink layer before forming the key pattern and the key wire;

forming a second insulation layer on the key pattern and the wire;

bonding a flexible circuit board to the back side of the cover plate body, such that a second end of the wire is connected with a first end of the flexible circuit board, a second end of the flexible circuit board is connected with the touch control circuit; and forming a second ink layer on the second insulation layer.

In an exemplary embodiment, the first insulation layer and the second insulation layer may be formed through screen printing or a photolithography process, such that the second insulation layer covers the key pattern and the key wire.

The above method may be used to manufacture the touch sensitive cover plate according to any of the above embodiments. The structure of the touch sensitive cover plate has been described and set forth hereinbefore and will not be repeated herein.

In the touch sensitive cover plate manufactured through the method of manufacturing the touch sensitive cover plate, through providing key patterns and wires at the back side of the cover plate body, the problem of virtual keys occupying the space of the display region when virtual keys are used can be avoided, and thereby the display region of the screen can be increased; at the same time, no flexible circuit board needs to be provided at the back side of the cover plate body, so that the thickness of the key region of the cover plate body is reduced, and the space for the flexible circuit board can be saved structurally.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

The invention claimed is:

1. A touch sensitive cover plate for covering a touch display device from outside, comprising:
   a single-piece cover plate body defining a key region and a display region and having at least one key located in a key region of the cover plate body; and
   at least one wire arranged on a back side face of the cover plate body and used for the key,
   wherein the wire is configured to connect the key to a circuit board located outside of the key region, the key region being located at a peripheral region of the cover plate with respect to the display region of the cover plate.

2. The touch sensitive cover plate according to claim 1, wherein the key comprises a touch key and the touch sensitive cover plate further comprises a key pattern disposed on the back side of the cover plate body.

3. The touch sensitive cover plate according to claim 2, wherein a first end of the wire is connected with the key pattern and a second end of the wire is connected with the circuit board.

4. The touch sensitive cover plate according to claim 2, wherein the touch sensitive cover plate further comprises a first ink layer, which is located between the cover plate body and the key pattern and between the cover plate body and the wire.

5. The touch sensitive cover plate according to claim 4, wherein the touch sensitive cover plate further comprises a first insulation layer, which is located between the first ink layer and the key pattern and between the first ink layer and the wire.

6. The touch sensitive cover plate according to claim 2, wherein the touch sensitive cover plate further comprises a second ink layer located above the key pattern and the wire.

7. The touch sensitive cover plate according to claim 6, wherein the touch sensitive cover plate further comprises a second insulation layer, which is located between the key pattern and the second ink layer and between the wire and the second ink layer.

8. The touch sensitive cover plate according to claim 2, wherein the touch sensitive cover plate further comprises a touch key indicator corresponding to the key pattern, the touch key indicator being located at the back side of the cover plate body and viewable from a front side of the cover plate body.

9. The touch sensitive cover plate according to claim 4, wherein the key pattern is provided with a window region, the first ink layer is provided with a first opening region at a position aligned with the window region, and the first opening region is configured to allow light emitted from the window region to be transmitted out from the first opening region.

10. The touch sensitive cover plate according to claim 6, wherein the key pattern is provided with a window region, the second ink layer is provided with a second opening region at a position aligned with the window region, and the second opening region is configured to allow light emitted from a light source to be transmitted to the window region.

11. The touch sensitive cover plate according to claim 2, wherein the wire is arranged around the key pattern.

12. The touch sensitive cover plate according to claim 3, wherein the second end of the wire and the circuit board are connected in a lapping region located at one side of the key region.

13. The touch sensitive cover plate according to claim 1, wherein the at least one key comprises a plurality of touch keys, the at least one wire comprises a plurality of wires, and the touch sensitive cover plate comprises:
a plurality of key patterns disposed on the back side of the cover plate body, each corresponding to a corresponding one of the touch keys; and
first and second lapping regions,
wherein the first and second lapping regions are located at two opposite sides of the key region respectively, second ends of a first part of the plurality of wires are connected to the first lapping region, and second ends of a second part of the plurality of wires are connected to the second lapping region.

14. The touch sensitive cover plate according to claim 2, wherein the key pattern and the wire are arranged in the same layer.

15. A touch sensitive display device, comprising:
a display panel;
a touch sensitive cover plate disposed on the display panel; and
a touch control circuit,
wherein the touch sensitive cover plate is the touch sensitive cover plate according to claim 1, and the wire is connected to the touch control circuit.

16. The touch sensitive display device according to claim 15, wherein the touch sensitive display device further comprises: the circuit board bonded to the back side of the cover plate body, a first end of each wire is connected to the key, a second end of each wire is connected with a first end of the circuit board, and a second end of the circuit board is connected to the touch control circuit.

17. A method of manufacturing a touch sensitive cover plate for covering a touch display device from outside, the method comprising:
forming at least one wire on a back side face of a single-piece cover plate body, which defines a key region and a display region,
wherein the cover plate body has at least one key located in the key region of the cover plate body, and the wire is formed to connect the key to a circuit board located outside of the key region, the key region being located at a peripheral region of the cover plate with respect to the display region of the cover plate.

18. The method according to claim 17, wherein the key comprises a touch key and the touch sensitive cover plate further comprises a key pattern disposed on the back side of the cover plate body, and wherein forming at least one wire on the back side of the cover plate body comprises:
forming the key pattern and the wire on the back side of the cover plate body through screen printing, exposing, or a photolithography process.

19. The method according to claim 18, further comprising: forming, on the back side of the cover plate body, a touch key indicator corresponding to the key pattern before forming the key pattern and the wire.

20. The method according to claim 18, further comprising:
forming a first ink layer on the back side of the cover plate body and forming a first insulation layer on the first ink layer, before forming the key pattern and the key wire;
forming a second insulation layer on the key pattern and the wire;
bonding the circuit board to the back side of the cover plate body, such that a second end of the wire is connected with a first end of the circuit board, a second end of the circuit board is connected with the touch control circuit; and
forming a second ink layer on the second insulation layer.

* * * * *